(12) United States Patent
Park et al.

(10) Patent No.: US 12,507,529 B2
(45) Date of Patent: Dec. 23, 2025

(54) ELECTROLUMINESCENT DISPLAY DEVICE INCLUDING A BUFFER LAYER DISPOSED ON A PASSIVATION LAYER OR A PLANARIZATION LAYER IN GIP AREA

(71) Applicant: LG Display Co., Ltd., Seoul (KR)

(72) Inventors: JoonWon Park, Seoul (KR); Hanil Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 609 days.

(21) Appl. No.: 17/944,938

(22) Filed: Sep. 14, 2022

(65) Prior Publication Data
US 2023/0200131 A1 Jun. 22, 2023

(30) Foreign Application Priority Data
Dec. 20, 2021 (KR) .......................... 10-2021-0182854

(51) Int. Cl.
*H01L 29/08* (2006.01)
*H10D 30/67* (2025.01)
*H10K 59/121* (2023.01)

(52) U.S. Cl.
CPC ...... *H10K 59/1213* (2023.02); *H10D 30/6755* (2025.01)

(58) Field of Classification Search
CPC .............. H10K 59/1213; H10D 30/6755
USPC .......................................................... 257/40
See application file for complete search history.

(56) References Cited

U.S. PATENT DOCUMENTS

| 9,276,017 | B2 | 3/2016 | Lee |
| 2014/0139772 | A1 | 5/2014 | Kim et al. |
| 2015/0187810 | A1 | 7/2015 | Lee |
| 2018/0350889 | A1* | 12/2018 | Son ................... H10K 59/1213 |
| 2019/0198811 | A1 | 6/2019 | Choi et al. |
| 2020/0152913 | A1 | 5/2020 | Noh et al. |

(Continued)

FOREIGN PATENT DOCUMENTS

| KR | 20130052669 A1 * | 5/2013 |
| KR | 10-2014-0064477 A | 5/2014 |
| KR | 10-2015-0078248 A | 7/2015 |

(Continued)

OTHER PUBLICATIONS

Cite the machine translation Kim M (KR-20180076858).*
(Continued)

*Primary Examiner* — Phuc T Dang
(74) *Attorney, Agent, or Firm* — Fenwick & West LLP

(57) ABSTRACT

An electroluminescent display device according to an exemplary embodiment of the present disclosure may include a substrate including an active area and a non-active area having a gate in panel (GIP) area outside the active area, an oxide thin film transistor disposed on the substrate in the GIP area, a passivation layer disposed on the oxide thin film transistor, a planarization layer disposed on the passivation layer, a buffer layer disposed on the passivation layer or the planarization layer in the GIP area and made of silicon nitride and a light emitting element disposed on the planarization layer and including an anode, a light emitting unit, and a cathode. As a result, by preventing hydrogen inflow into an oxide thin film transistor, characteristics and reliability of the thin film transistor can be improved.

23 Claims, 9 Drawing Sheets

(56) References Cited

U.S. PATENT DOCUMENTS

2021/0202634 A1* 7/2021 Moon ................ H10K 59/1213

FOREIGN PATENT DOCUMENTS

| KR | 20180076858 | * | 7/2018 |
| KR | 10-2019-0076152 A | | 7/2019 |
| KR | 10-2020-0036158 A | | 4/2020 |
| KR | 10-2020-0054734 A | | 5/2020 |
| KR | 10-2020-0060941 A | | 6/2020 |

OTHER PUBLICATIONS

Cite the machine translation Jung B (KR-20130052669-A1).*
Korean Intellectual Property Administration, Office Action, KR Patent Application No. 10-2021-0182854, Jun. 30, 2025, 13 pages.

* cited by examiner

ELECTROLUMINESCENT DISPLAY DEVICE INCLUDING A BUFFER LAYER DISPOSED ON A PASSIVATION LAYER OR A PLANARIZATION LAYER IN GIP AREA

CROSS-REFERENCE TO RELATED APPLICATIONS

This application claims the benefit of and priority to Korean Patent Application No. 10-2021-0182854 filed on Dec. 20, 2021 in the Republic of Korea, the entire contents of which are hereby expressly incorporated by reference into the present application.

BACKGROUND

Technical Field

The present disclosure relates to an electroluminescent display device, and more particularly, to an electroluminescent display device using an oxide thin film transistor.

Discussion of the Related Art

Recently, as our society advances toward an information-oriented society, the field of display devices for visually expressing an electrical information signal has rapidly advanced. Various display devices having excellent performance in terms of thinness, lightness, and low power consumption, are being developed correspondingly.

Representative display devices include a liquid crystal display device (LCD), an electro-wetting display device (EWD), an organic light emitting display device (OLED), and the like.

Among these display devices, an electroluminescent display device including an organic light emitting display device is a self-emission display device, and can be manufactured to be light and thin since it does not require a separate light source, unlike a liquid crystal display device having a separate light source. In addition, the electroluminescent display device has advantages in terms of power consumption due to a low voltage driving, and is excellent in terms of a color implementation, a response speed, a viewing angle, and a contrast ratio (CR). Therefore, electroluminescent display devices are expected to be utilized in various fields.

The electroluminescent display device is constructed by disposing a light emitting layer using an organic material between two electrodes that are referred to as an anode and a cathode. Then, when holes from the anode are injected into the light emitting layer and electrons from the cathode are injected into the light emitting layer, the injected electrons and holes recombine with each other to form excitons in the light emitting layer and emit light.

SUMMARY

An aspect of the present disclosure is to provide an electroluminescent display device in which hydrogen inflow into an oxide thin film transistor in a gate in panel (GIP) area is prevented.

Objects of the present disclosure are not limited to the above-mentioned objects, and other objects, which are not mentioned above, can be clearly understood by those skilled in the art from the following descriptions.

An electroluminescent display device according to an exemplary embodiment of the present disclosure may include a substrate including an active area and a non-active area having a gate in panel (GIP) area outside the active area, an oxide thin film transistor disposed on the substrate in the GIP area, a passivation layer disposed on the oxide thin film transistor, a planarization layer disposed on the passivation layer, a buffer layer disposed on the passivation layer or the planarization layer in the GIP area and made of silicon nitride and a light emitting element disposed on the planarization layer and including an anode, a light emitting unit, and a cathode.

An electroluminescent display device according to another exemplary embodiment of the present disclosure may include a substrate including an active area and a non-active area having a gate in panel (GIP) area outside the active area, an oxide thin film transistor disposed on the substrate in the GIP area, a passivation layer disposed on the oxide thin film transistor, a planarization layer disposed on the passivation layer, a buffer layer disposed on the passivation layer or the planarization layer, a light emitting element disposed on the planarization layer and including an anode, a light emitting unit, and a cathode and an encapsulation layer disposed on the light emitting element, wherein the buffer layer may be made of silicon nitride and disposed in the GIP area to thereby block diffusion of external hydrogen or hydrogen in the encapsulation layer into the oxide thin film transistor therebelow.

Other detailed matters of the exemplary embodiments are included in the detailed description and the drawings.

According to the present disclosure, hydrogen inflow into an oxide thin film transistor is prevented by forming a buffer layer formed of silicon nitride below a bank in a gate in panel (GIP) area, so that characteristics and reliability of the thin film transistor can be improved.

The effects according to the present disclosure are not limited to the contents exemplified above, and more various effects are included in the present specification.

DETAILED DESCRIPTION OF THE EMBODIMENTS

Figure 1:
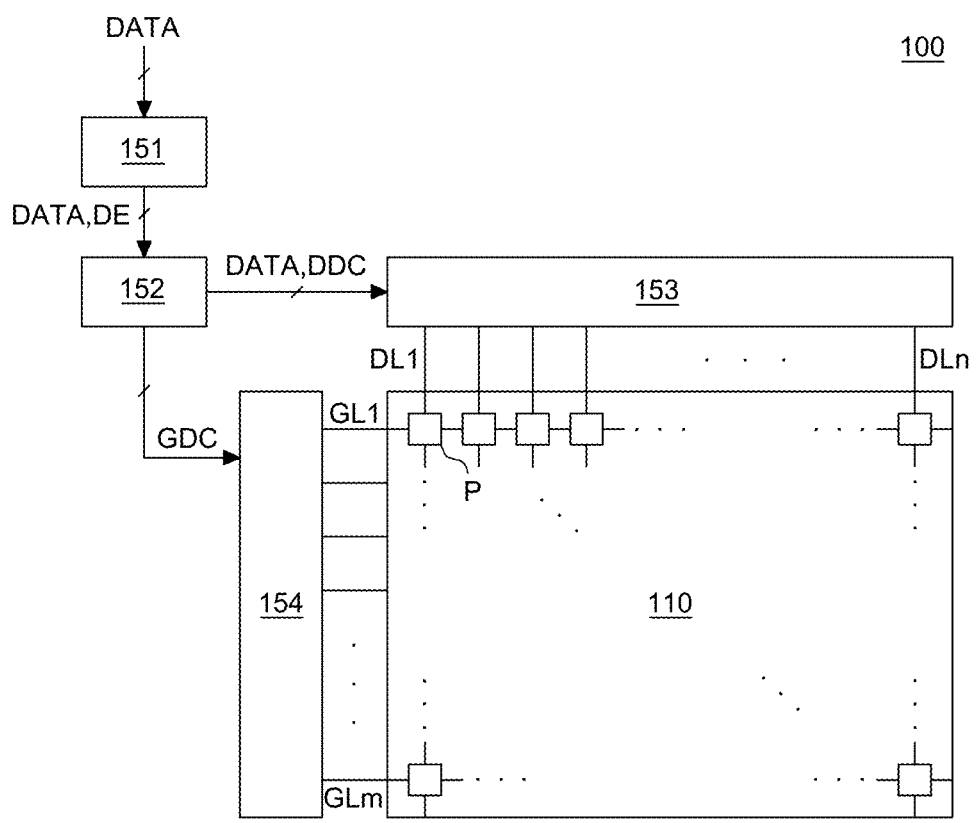
FIG. 1 is a block diagram of an electroluminescent display device according to a first exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, exemplary embodiments of the present disclosure will be described in detail with reference to accompanying drawings.

FIG. 1 is a block diagram of an electroluminescent display device according to a first exemplary embodiment of the present disclosure.

Referring to FIG. 1, an electroluminescent display device 100 according to the first exemplary embodiment of the present disclosure may include an image processor 151, a timing controller 152, a data driver 153, a gate driver 154, and a display panel 110.

The image processor 151 may output a data signal DATA and a data enable signal DE through a data signal DATA supplied from the outside.

The image processor 151 may output one or more of a vertical synchronization signal, a horizontal synchronization signal, and a clock signal in addition to the data enable signal DE.

The timing controller 152 receives the data signal DATA together with the data enable signal DE or driving signals including the vertical synchronization signal, the horizontal synchronization signal, and the clock signal from the image processor 151. The timing controller 152 may output a gate timing control signal GDC for controlling an operation timing of the gate driver 154 and a data timing control signal DDC for controlling an operation timing of the data driver 153 based on the driving signals.

The data driver 153 samples and latches the data signal DATA supplied from the timing controller 152 in response to the data timing control signal DDC supplied from the timing controller 152, and converts the data signal DATA into a gamma reference voltage to thereby output it. The data driver 153 may output the data signal DATA through data lines DL1 to DLn.

The gate driver 154 may output a gate signal while shifting a level of the gate voltage in response to the gate timing control signal GDC supplied from the timing controller 152. The gate driver 154 may output the gate signal through gate lines GL1 to GLm.

The display panel 110 may display an image while sub-pixels P emit light in response to the data signal DATA and the gate signal supplied from the data driver 153 and the gate driver 154. A detailed structure of the sub-pixel P will be described in detail in FIG. 2 and FIG. 5.

Figure 2:
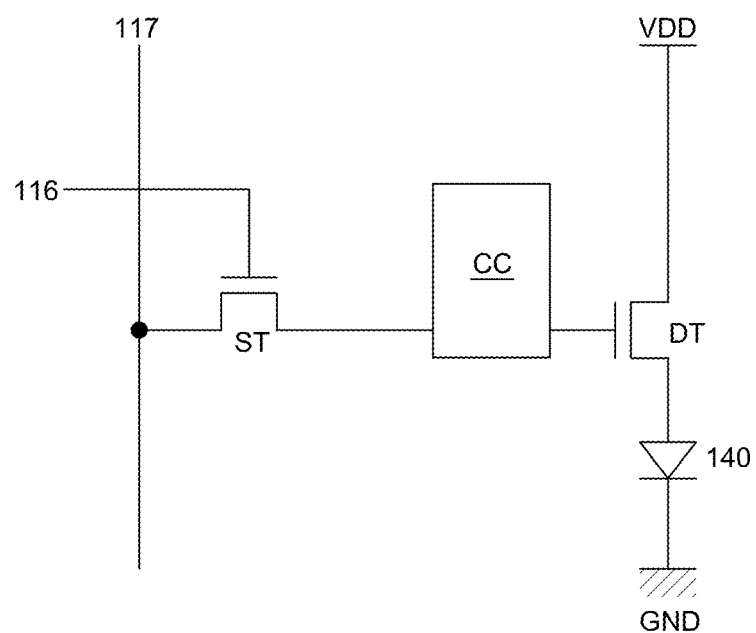
FIG. 2 is a circuit diagram of a sub-pixel of the electroluminescence display device according to the first exemplary embodiment of the present disclosure.

FIG. 2 is a circuit diagram of a sub-pixel included in the electroluminescent display device according to the first exemplary embodiment of the present disclosure.

Referring to FIG. 2, the sub-pixel of the electroluminescent display device 100 according to the first exemplary embodiment of the present disclosure may include a switching transistor ST, a driving transistor DT, a compensation circuit CC, and a light emitting element 140.

The light emitting element 140 may operate to emit light according to a driving current that is formed by the driving transistor DT.

The switching transistor ST may perform a switching operation such that a data signal supplied through a data line 117 in response to the gate signal supplied through a gate line 116 is stored as a data voltage in a capacitor.

The driving transistor DT may operate such that a constant driving current flows between a high potential power line VDD and a low potential power line GND in response to the data voltage stored in the capacitor.

The compensation circuit CC is a circuit for compensating for a threshold voltage or the like of the driving transistor DT, and the compensation circuit CC may include one or more thin film transistors and capacitors. A configuration of the compensation circuit CC may vary according to a compensation method.

It is illustrated that the sub-pixel shown in FIG. 2 is configured to have a 2T(Transistor)1C (Capacitor) structure including the switching transistor ST, the driving transistor DT, the capacitor, and the light emitting element 140. However, the sub-pixel may have various structures, such as 3T1C, 4T2C, 5T2C, 6T1C, 6T2C, 7T1C and 7T2C structures when the compensation circuit CC is added thereto.

Figure 3:
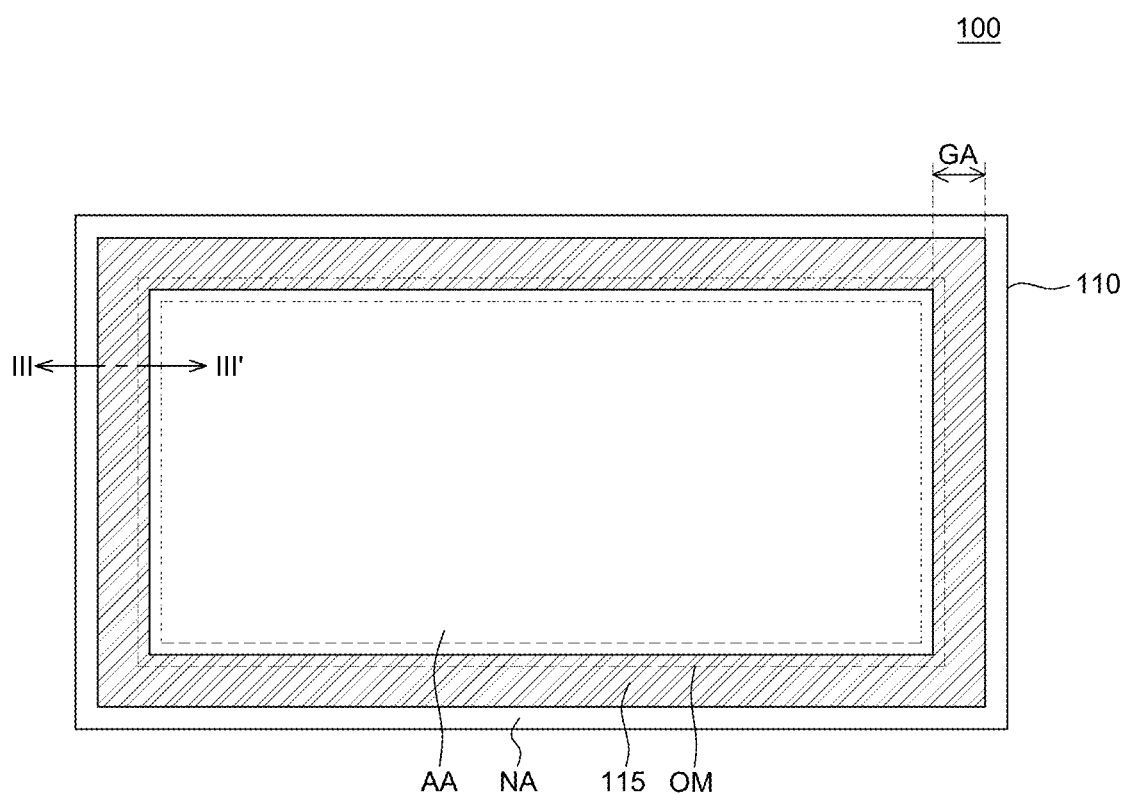
FIG. 3 is a plan view of the electroluminescent display device according to the first exemplary embodiment of the present disclosure.

FIG. 3 is a plan view of the electroluminescent display device according to the first exemplary embodiment of the present disclosure.

Figure 4:
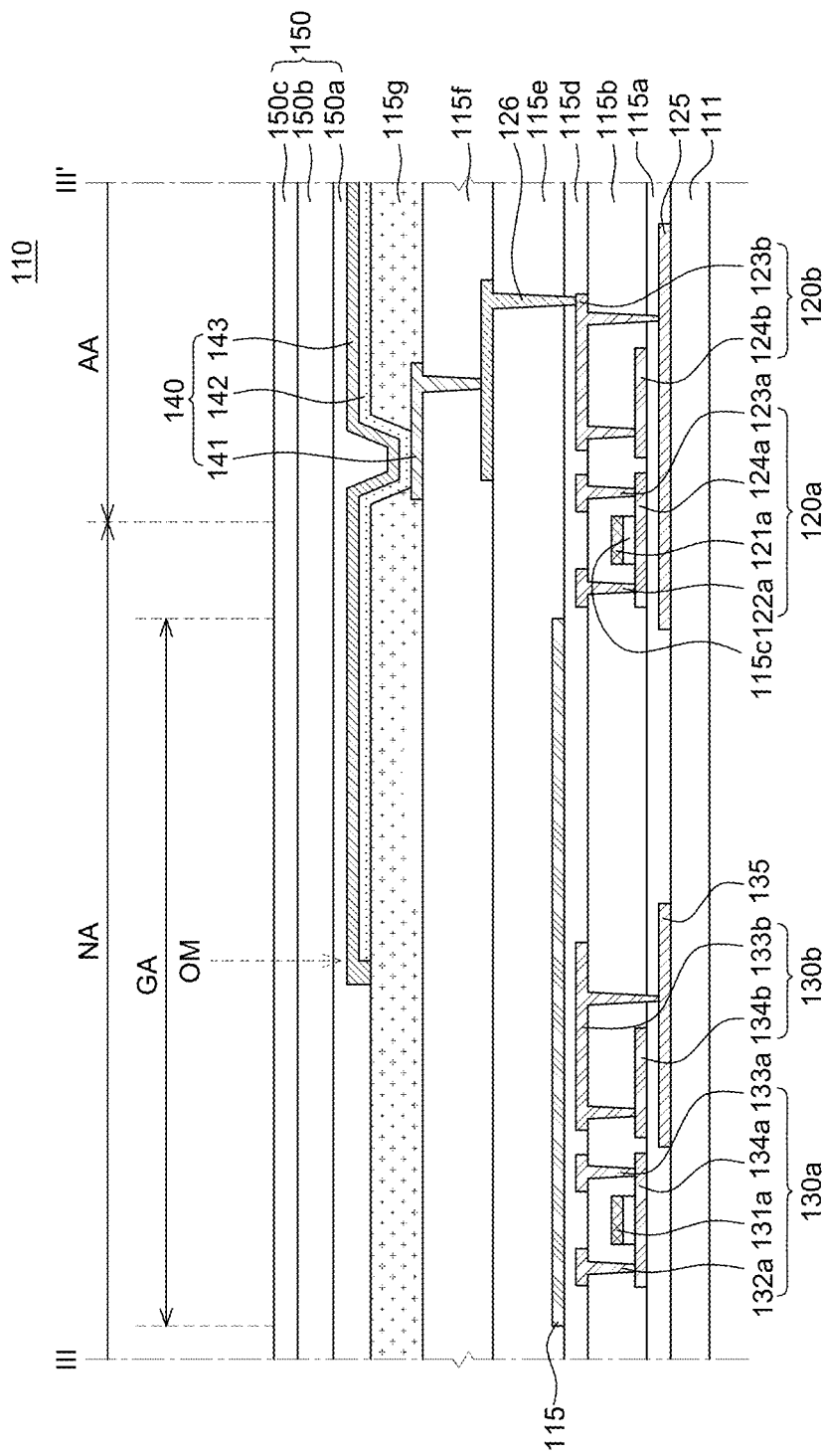
FIG. 4 is a cross-sectional view taken along line III-III' of FIG. 3.

FIG. 4 is a cross-sectional view taken along line III-III' of FIG. 3.

FIG. 4 illustrates a portion of a cross-section of the display panel 110 according to the first exemplary embodiment including a gate in panel (GIP) area GA.

Referring to FIG. 3, the electroluminescent display device 100 according to the first exemplary embodiment of the present disclosure may include the display panel 110, flexible films, and a printed circuit board.

The display panel 110 is a panel for displaying an image to a user.

In the display panel 110, display elements for displaying an image, a driving element for driving the display elements, and lines for transmitting various signals to the display elements and the driving element may be disposed. The display element may be defined differently according to a type of the display panel 110. For example, when the display panel 110 is an organic light emitting display panel, the display element is an organic light emitting element including an anode, an organic light emitting layer, and a cathode.

Hereinafter, it is described assuming that the display panel 110 is an organic light emitting display panel, but the display panel 110 is not limited to the organic light emitting display panel.

The display panel 110 may include an active area AA and a non-active area NA.

The active area AA is an area in which an image is displayed on the display panel 110.

A plurality of sub-pixels constituting a plurality of pixels and a circuit for driving the plurality of sub-pixels may be disposed in the active area AA. The plurality of sub-pixels are minimum units constituting the active area AA, and the display element may be disposed in each of the plurality of sub-pixels, and the plurality of sub-pixels may constitute the pixel. For example, an organic light emitting element including an anode, an organic light emitting layer, and a cathode may be disposed in each of the plurality of sub-pixels, but is not limited thereto. In addition, the circuit for driving the plurality of sub-pixels may include a driving element, lines and the like. For example, the circuit may be formed of a thin film transistor, a storage capacitor, a gate line, a data line, and the like, but is not limited thereto.

The non-active area NA is an area in which an image is not displayed.

FIG. 3 illustrates that the non-active area NA surrounds the active area AA having a quadrangular shape, but shapes and arrangements of the active area AA and the non-active area NA are not limited to the example illustrated in FIG. 3.

The active area AA and the non-active area NA may have a shape suitable for designing an electronic apparatus on which the electroluminescent display device 100 is mounted. For example, another exemplary shape of the active area AA may be a pentagonal shape, a hexagonal shape, a circular shape, or an oval shape.

Various lines and circuits for driving the organic light emitting element of the active area AA may be disposed in the non-active area NA. For example, in the non-active area NA, driver ICs such as a gate driver IC and a data driver IC or link lines for transmitting signals to the plurality of sub-pixels and circuits of the active area AA may be disposed, but are not limited thereto.

Meanwhile, left and right sides of FIG. 3 may be defined as a gate pad portion on which the gate driver IC is disposed, and a lower side of FIG. 3 may be defined as a data pad portion to which the flexible films are connected, but the present disclosure is not limited thereto.

In this case, the gate driver IC may be formed independently of the display panel 110 and may be configured in a form capable of being electrically connected to the display panel 110 in various manners, but may be configured in a method of a gate in panel (GIP) that is mounted in the display panel 110.

The electroluminescent display device may include various additional elements for generating various signals or driving the pixels in the active area AA. The additional elements for driving the pixels may include an inverter circuit, a multiplexer, an electro-static discharge (ESD) circuit, and the like. The electroluminescent display device may include additional elements associated with functions other than driving the pixels. For example, the electroluminescent display device may include additional elements that provide a touch sensing function, a user authentication function (e.g., fingerprint recognition), a multi-level pressure sensing function, a tactile feedback function, and the like. Such additional elements may be positioned in the non-active area NA and/or in an external circuit connected to a connection interface.

Although not illustrated, the flexible films are films for supplying signals to the plurality of sub-pixels and circuits of the active area AA, and may be electrically connected to the display panel 110. The flexible films may be disposed at one end of the non-active area NA of the display panel 110 and supply a power voltage, a data voltage and the like to the plurality of sub-pixels and circuits of the active area AA. For example, a driver IC such as a data driver IC may be disposed on the flexible films.

The printed circuit board may be disposed at one ends of the flexible films and connected to the flexible films. The printed circuit board is a component that supplies signals to the driver IC. The printed circuit board may supply various signals such as a driving signal and a data signal to the driver IC.

Meanwhile, excellent characteristics of the display panel are secured by using an oxide thin film transistor having characteristics of high mobility and low off current. That is, when the oxide thin film transistor is used, it is advantageous in manufacturing the display panel 110 having a large area as well as in terms of low power, stability, and cost reduction. In particular, when a thin film transistor in the GIP area GA is formed of an oxide thin film transistor in the same manner as in the active area AA, there is an advantage in that the number of processes and costs are reduced. However, the oxide thin film transistor has a disadvantage in that an initial characteristic, for example, a threshold voltage Vth, is changed by hydrogen generated within the display panel 110.

The electroluminescent display device includes a light emitting unit formed of an organic layer for self-emission, and while a shadow mask is used in depositing the organic layer, damage may occur in an outside of the active area AA due to detachment of the mask. In a process of aligning the mask, a mark due to mask pressing may occur in an edge perimeter OM of the light emitting unit, and foreign materials may be generated by the mark due to mask pressing. External moisture or hydrogen or hydrogen in an encapsulation layer diffuses into a seam of these foreign materials and moves to the oxide thin film transistor of the GIP area GA therebelow, which may cause a driving failure of the oxide thin film transistor. As a result, stains of white stripes may occur at the outside of the active area.

Meanwhile, silicon nitride (SiNx) has density higher than that of silicon oxide (SiOx), so that it is effective in preventing hydrogen diffusion.

Accordingly, the present disclosure is characterized in that a buffer layer 115 formed of silicon nitride is formed in the GIP area GA in a circumferential portion of the display panel 110 to thereby prevent hydrogen diffusion into the oxide thin film transistor in the GIP area GA.

However, in the case of the display panel 110 of a high-resolution, since a plurality of contact holes are disposed in the active area AA in design, the contact holes act as sink holes of hydrogen, thereby causing bright spot defects when the buffer layer 115 is formed even in the active area AA.

Accordingly, the first exemplary embodiment of the present disclosure is characterized in that the buffer layer 115 is formed in a quadrangular frame shape in the GIP area GA other than the active area AA to thereby protect the oxide thin film transistor of the GIP area GA from damage due to the mask during deposition of the organic material. Accordingly, characteristics and reliability of the thin film transistor may be improved. In addition, it is possible to improve a yield of the electroluminescent display device 100 to which the oxide thin film transistor is applied.

The buffer layer 115 of the present disclosure may be formed on a passivation layer or a planarization layer, or an interlayer insulating layer above a semiconductor layer among insulating layers under a bank.

Specifically, referring to FIGS. 3 and 4, a substrate 111 may be divided into the active area AA and the non-active area NA outside the active area AA.

First and second thin film transistors 120a and 120b, the light emitting element 140, and an encapsulation layer 150 may be disposed in the active area AA of the substrate 111.

The non-active area NA of the substrate 111 may include the GIP area GA.

Third and fourth thin film transistors 130a and 130b and the encapsulation layer 150 may be disposed in the GIP area GA of the substrate 111.

The substrate 111 serves to support and protect components of the electroluminescent display device disposed thereon.

Recently, the flexible substrate 111 may be used with a flexible material having flexible characteristics such as plastic.

The flexible substrate 111 may be in a form of a film including one of the group consisting of a polyester-based polymer, a silicone-based polymer, an acrylic polymer, a polyolefin-based polymer, and a copolymer thereof.

Light blocking layers 125 and 135 may be disposed on the substrate 111.

The light blocking layers 125 and 135 may include a first light blocking layer 125 disposed in the active area AA and a second light blocking layer 135 disposed in the GIP area GA.

The light blocking layers 125 and 135 may be formed of a metallic material having a light blocking function in order to block external light from flowing into semiconductor layers 124a, 124b, 134a, and 134b.

The light blocking layers 125 and 135 may be formed in a single layer or multilayer structure formed of any one of opaque metals such as aluminum (Al), chromium (Cr), tungsten (W), titanium (Ti), nickel (Ni), neodymium (Nd), molybdenum (Mo) and copper (Cu), or alloys thereof.

A buffer layer 115a may be disposed over the substrate 111 on which the light blocking layers 125 and 135 are disposed.

The buffer layer 115a may be formed in a structure in which a single insulating layer or a plurality of insulating layers are stacked in order to block foreign materials including moisture, oxygen and the like, flowing from the substrate 111. That is, the buffer layer 115a may be formed of a single layer or multilayer structure of an inorganic insulating material such as silicon oxide (SiOx), silicon nitride (SiNx), or aluminum oxide (AlOx). The buffer layer 115a may be deleted according to types of the thin film transistors 120a, 120b, 130a, and 130b.

The buffer layer 115a may include contact holes exposing a portion of the light blocking layers 125 and 135.

The thin film transistors 120a, 120b, 130a, and 130b may be disposed on the buffer layer 115a.

The first thin film transistor 120a in the active area AA may be a switching transistor.

The switching transistor is turned on by a gate pulse supplied to a gate line and transmits a data voltage that is supplied to a data line to a gate electrode of a driving transistor.

To this end, the first thin film transistor 120a may include a first gate electrode 121a, a first source electrode 122a, a first drain electrode 123a, and a first semiconductor layer 124a.

The second thin film transistor 120b in the active area AA may be a driving transistor, and only a part of the driving transistor is illustrated in FIG. 4 for convenience. Other sensing transistors and compensation circuits may also be included in the electroluminescent display device 100.

The driving transistor may transmit a current that is transmitted through a power line to an anode 141 according to a signal received from the switching transistor, and may control light emission by the current transmitted to the anode 141.

To this end, the second thin film transistor 120b may include a second gate electrode, a second source electrode, a second drain electrode 123b, and a second semiconductor layer 124b.

Meanwhile, the third thin film transistor 130a in the GIP area GA may be a switching transistor.

For example, the third thin film transistor 130a may include a third gate electrode 131a, a third source electrode 132a, a third drain electrode 133a, and a third semiconductor layer 134a.

The fourth thin film transistor 130b in the GIP area GA may be a driving transistor, and only a part of the driving transistor is illustrated in FIG. 4 for convenience.

For example, the fourth thin film transistor 130b may include a fourth gate electrode, a fourth source electrode, a fourth drain electrode 133b, and a fourth semiconductor layer 134b.

The semiconductor layers 124a, 124b, 134a, and 134b may be formed of an oxide semiconductor. When an oxide thin film transistor having high mobility and low off current characteristics is used, excellent characteristics of the display panel 110 may be secured. In particular, when the third and fourth thin film transistors 130a and 130b in the GIP area GA are formed of oxide thin film transistors in the same manner as in the active area AA, the number of processes and costs are reduced.

The oxide semiconductor has excellent mobility and uniformity properties. The oxide semiconductor may be formed of a quaternary metal oxide such as an indium tin gallium zinc oxide (InSnGaZnO)-based material, a ternary metal oxide such as an indium gallium zinc oxide (InGaZnO)-based material, an indium tin zinc oxide (InSnZnO)-based material, an indium aluminum zinc oxide (InAlZnO)-based material, a tin gallium zinc oxide (SnGaZnO)-based material, an aluminum gallium zinc oxide (AlGaZnO)-based material, and a tin aluminum zinc oxide (SnAlZnO)-based material, or a binary metal oxide such as an indium zinc oxide (InZnO)-based material, a tin zinc oxide (SnZnO)-based material, an aluminum zinc oxide (AlZnO)-based material, a zinc magnesium oxide (ZnMgO)-based material, a tin magnesium oxide (SnMgO)-based material, an indium magnesium oxide (InMgO)-based material, an indium oxide (InO)-based material, a tin oxide (SnO)-based material, an indium gallium oxide (InGaO)-based material, and a zinc oxide (ZnO)-based material. Composition ratios of the respective elements are not limited.

The semiconductor layers 124a, 124b, 134a, and 134b may include a source region including p-type or n-type impurities, a drain region, and a channel region between the source region and the drain region, and may further include a low concentration doped region between the source region and the drain region adjacent to the channel region, but the present disclosure is not limited thereto.

The source region and the drain region are regions doped with a high concentration of impurities, and may be connected to the source electrodes 122a and 132a and the drain electrodes 123a, 123b, 133a, and 133b of the thin film transistors 120a, 120b, 130a, and 130b, respectively.

As an impurity ion, the p-type impurity or n-type impurity may be used. The p-type impurity may be one of boron (B), aluminum (Al), gallium (Ga), and indium (In), and the n-type impurity may be one of phosphorus (P), arsenic (As), and antimony (Sb).

The channel region may be doped with the n-type impurity or p-type impurity according to an NMOS or PMOS transistor structure.

A second insulating layer 115b may be disposed as an interlayer insulating layer between the gate electrodes 121a and 131a, the source electrodes 122a and 132a, and the drain electrodes 123a, 123b, 133a, and 133b.

The second insulating layer 115b may be formed of a single layer of silicon oxide (SiOx) or silicon nitride (SiNx), or multiple layers thereof.

In addition, a third insulating layer 115c may be disposed as a gate insulating layer between the gate electrodes 121a and 131a and the semiconductor layers 124a, 124b, 134a and 134b. At this time, the third insulating layer 115c is composed of a single layer of silicon oxide (SiOx) or silicon nitride (SiNx), or multiple layers thereof, and may be disposed between the gate electrodes 121a and 131a and the semiconductor layers 124a, 124b, 134a, and 134b such that current flowing through the semiconductor layers 124a, 124b, 134a, and 134b do not flow to the gate electrodes 121a and 131a. Silicon oxide is less ductile than metal, but is superior in ductility to silicon nitride and may be formed as a single layer or multiple layers according to characteristics thereof.

The gate electrodes 121a and 131a may be composed of a single layer or multiple layers of a conductive metal such as copper (Cu), aluminum (Al), chromium (Cr), molybdenum (Mo), gold (Au), titanium (Ti), nickel (Ni), neodymium (Nd) and the like, or alloys thereof, but the present disclosure is not limited thereto.

In addition, the source electrodes 122a and 132a and the drain electrodes 123a, 123b, 133a, and 133b may be composed of a single layer or multiple layers of a conductive metal such as aluminum (Al), molybdenum (Mo), chromium (Cr), gold (Au), titanium (Ti), nickel (Ni), neodymium (Nd), copper (Cu) and the like, or alloys thereof, but the present disclosure is not limited thereto.

The second and fourth drain electrodes 123b and 133b may have one sides that are electrically connected to the second and fourth semiconductor layers 124b and 134b, respectively, and have the other sides electrically connected to the first and second light blocking layers 125 and 135, respectively, but the present disclosure is not limited thereto.

A passivation layer 115d may be disposed on the thin film transistors 120a, 120b, 130a, and 130b. The passivation layer 115d may be formed of an inorganic insulating layer such as silicon oxide (SiOx) or silicon nitride (SiNx). However, when the semiconductor layers 124a, 124b, 134a, and 134b are formed of an oxide semiconductor, it is preferable to form the passivation layer 115d with silicon oxide (SiOx).

The passivation layer 115d may serve to prevent unnecessary electrical connection between components disposed thereon and therebelow and to prevent contamination or damage from the outside, and may be omitted according to configurations and characteristics of the thin film transistors 120a, 120b, 130a, and 130b and the light emitting element 140.

Meanwhile, the first exemplary embodiment of the present disclosure is characterized in that the buffer layer 115 formed of silicon nitride is formed in the GIP area GA in the circumferential portion of the display panel 110 to thereby prevent hydrogen diffusion into the third and fourth thin film transistors 130a and 130b in the GIP area GA.

The buffer layer 115 may be disposed on the passivation layer 115d in the GIP area GA, but is not limited thereto.

However, in the case of the display panel 110 of a high-resolution, since a plurality of contact holes are disposed in the active area AA in design, the contact holes act as sink holes of hydrogen, thereby causing bright spot defects when the buffer layer 115 is formed even in the active area AA.

Accordingly, the first exemplary embodiment of the present disclosure is characterized in that the buffer layer 115 is formed in a quadrangular frame shape in the GIP area GA other than the active area AA. That is, the buffer layer 115 may have a quadrangular frame shape surrounding a perimeter (vicinity) of the active area AA.

The buffer layer 115 may be disposed in the GIP area GA including an end of the light emitting unit 142. That is, in a process of aligning the mask during deposition of the organic layer, a mark due to mask pressing may occur in the edge perimeter OM of the light emitting unit 142 and foreign materials may be generated due to the mark due to mask pressing, so that the buffer layer 115 may be disposed in the GIP area GA including an edge of the light emitting unit 142. In addition, the buffer layer 115 may not include a contact hole therein or may not come into contact with a contact hole formed in an upper layer or a lower layer thereof so as to more effectively protect the third and fourth oxide thin film transistors 130a and 130b in the GIP area GA and so as not to act as a sink hole of hydrogen. The buffer layer 115 is disposed along an upper surface of the lower layer thereof, and the upper layer thereof is disposed to cover the buffer layer 115. In addition, the buffer layer 115 may be disposed below the end of the light emitting unit 142 and may be disposed over the third and fourth thin film transistors 130a and 130b in the GIP area GA to cover the contact holes due to the third and fourth thin film transistors 130a and 130b in the GIP area GA.

The electroluminescent display device includes a light emitting unit formed of an organic layer for self-emission, and foreign materials may be generated by a mark due to mask pressing when the organic layer is deposited. External moisture or hydrogen or hydrogen in an encapsulation layer diffuses through a mask-pressed region and moves to the oxide thin film transistor in the GIP area GA therebelow, thereby inducing conductorization of the oxide thin film transistor. As a result, stains of white stripes may occur at the outside of the active area.

Figure 5:
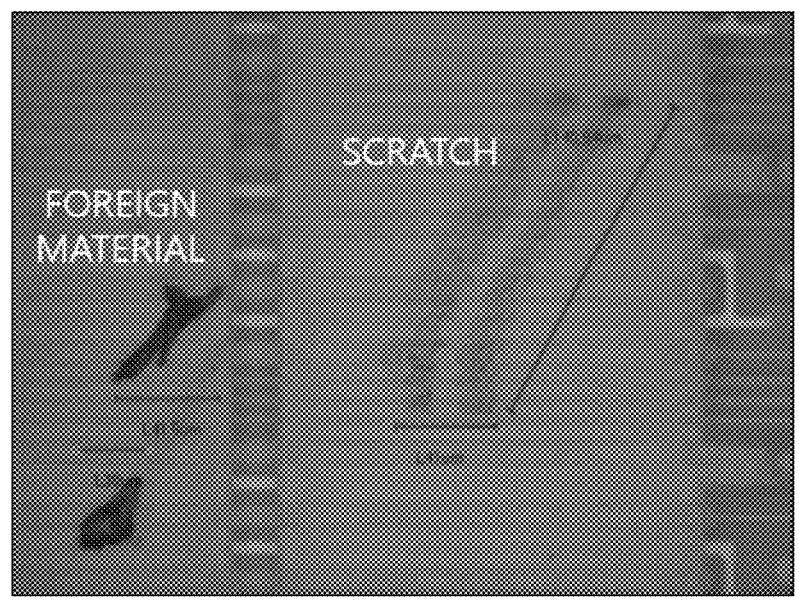
FIG. 5 is a photograph showing marks due to mask pressing.

FIG. 5 is a photograph showing marks due to mask pressing.

FIG. 5 is a micrograph that is obtained by observing a portion of the non-active area outside of the active area at a magnification of 50 times after the light emitting element is formed. FIG. 5 shows a portion of the non-active area where an end of the light emitting unit is positioned.

Referring to FIG. 5, it can be seen that a plurality of foreign materials and scratches exist in the non-active area outside the active area.

As described above, it can be seen that foreign materials due to scratches are generated during mask alignment for depositing the organic layer of the light emitting unit in a chamber. External moisture or hydrogen or hydrogen generated in the encapsulation layer may penetrate into a seam due to the foreign materials and may diffuse into the oxide thin film transistor in the GIP area GA through a bank and first and second planarization layers. The hydrogen diffusing into the GIP area GA may cause damage to an underlying oxide semiconductor layer over time and cause a negative shift in threshold voltage Vth. Accordingly, stains of white stripes may occur along an edge of the active area.

Referring back to FIGS. 3 and 4, the present disclosure is characterized in that a configuration capable of preventing hydrogen diffusion into the third and fourth thin film transistors 130a and 130b is added to the GIP area GA. According to this, as hydrogen diffusion into the third and fourth thin film transistors 130a and 130b in the GIP area GA is blocked, the third and fourth thin film transistors 130a and 130b are prevented from being conductive, so that white band unevenness may be improved.

To this end, the first exemplary embodiment of the present disclosure is characterized in that the buffer layer 115 is disposed on the passivation layer 115d in the GIP area GA, but is disposed in a quadrangular frame shape in the GIP area GA other than the active area AA.

In the case of the first exemplary embodiment of the present disclosure, it can be seen that even if a mark due to mask pressing occurs, foreign material bright spots and stains of white stripes do not occur as the buffer layer 115 prevents diffusion of hydrogen flowing from an upper portion thereof.

Meanwhile, the thin film transistors 120a, 120b, 130a, and 130b may be classified into an inverted staggered structure and a coplanar structure according to positions of components constituting the thin film transistors 120a, 120b, 130a, and 130b. In this case, for example, in a thin film transistor having an inverted staggered structure, a gate electrode may be positioned on opposite sides of a source electrode and a drain electrode with respect to a semiconductor layer. As shown in FIG. 4, in the thin film transistors 120a, 120b, 130a, and 130b having a coplanar structure, the gate electrodes 121a and 131a may be positioned on the same sides of the source electrodes 122a and 132a and the drain electrodes 123a, 123b, 133a, and 133b.

FIG. 4 illustrates the thin film transistors 120a, 120b, 130a, and 130b having the coplanar structure, but the electroluminescent display device 100 according to the first exemplary embodiment of the present disclosure may include a thin film transistor having the inverted staggered structure. In addition, some of the thin film transistors 120a, 120b, 130a, and 130b may have the coplanar structure, and some of the thin film transistors 120a, 120b, 130a, and 130b may have the inverted staggered structure.

The planarization layers 115e and 115f may be disposed on the thin film transistors 120a, 120b, 130a, and 130b to protect the thin film transistors 120a, 120b, 130a, and 130b and alleviate a step caused by them and to reduce parasitic capacitance occurring between the thin film transistors 120a, 120b, 130a, and 130b, the gate line and the data line, and the light emitting element 140.

The planarization layers 115e and 115f may be formed of one or more materials among acrylic resin, epoxy resin, phenolic resin, polyamides resin, polyimides resin, unsaturated polyesters resin, polyphenylene resin, polyphenylene sulfides resin, and benzocyclobutene, but the present disclosure is not limited thereto.

In this case, a first planarization layer 115e may be disposed on the thin film transistors 120a, 120b, 130a, and 130b, and a second planarization layer 115f may be disposed on the first planarization layer 115e.

An intermediate electrode 126 may be connected to the thin film transistors 120a and 120b through a contact hole formed in the first planarization layer 115e. For example, the intermediate electrode 126 may be stacked to be connected to the second thin film transistor 120b.

Meanwhile, the light emitting element 140 including the anode 141, the light emitting unit 142, and a cathode 143 may be disposed on the second planarization layer 115f.

The anode 141 may be disposed on the second planarization layer 115f.

The anode 141 is an electrode serving to supply holes to the light emitting unit 142, and may be connected to the second thin film transistor 120b through a contact hole in the second planarization layer 115f.

In the case of a bottom emission type in which light is emitted to a lower portion where the anode 141 is disposed, the anode 141 may be formed of indium tin oxide (ITO), indium zinc oxide (IZO), or the like, which is a transparent conductive material, but the present disclosure is not limited thereto.

Meanwhile, in the case of a top emission type in which light is emitted to an upper portion where the 143 is disposed, the anode 141 may further include a reflective layer such that the emitted light is reflected from the anode 141 and is smoothly emitted in a direction toward the upper portion where the cathode 143 is disposed.

That is, the anode 141 may be a two-layer structure in which a transparent conductive layer formed of a transparent conductive material and a reflective layer are sequentially stacked, or a three-layer structure in which a transparent conductive layer, a reflective layer and a transparent conductive layer are sequentially stacked. The reflective layer may be formed of silver (Ag) or an alloy including silver.

Meanwhile, it is preferable to position the end of the light emitting unit 142 in the buffer layer 150 in the GIP area GA. This is because, when the organic layer of the light emitting unit 142 is deposited, pressing of an alignment mask is caused around the end of the light emitting unit 142.

A bank 115g may be disposed on the anode 141 and the second planarization layer 115f.

The bank 115g that is disposed on the anode 141 and the second planarization layer 115f may define sub-pixels by partitioning an area that actually emits light, that is, an emission area.

After a photoresist is formed on the anode 141, the bank 115g may be formed through a photolithography process. The photoresist refers to a photosensitive resin of which solubility in a developer is changed by an action of light, and a specific pattern can be obtained by exposing and developing the photoresist. The photoresist can be classified into a positive type photoresist and a negative type photoresist. In this case, the positive photoresist refers to a photoresist of which solubility in a developer for an exposed portion is increased by exposure, and when the positive photoresist is developed, a pattern in which the exposed portion is removed is obtained. The negative photoresist refers to a photoresist of which solubility in a developer for an exposed portion is lowered by exposure, and when the negative photoresist is developed, a pattern in which an unexposed portion is removed is obtained.

A fine metal mask (FMM), which is a deposition mask, may be used to form the light emitting unit 142 of the light emitting element 140.

In addition, in order to prevent damage that may be caused by contact with the deposition mask disposed on the bank 115g and to maintain a constant distance between the bank 115g and the deposition mask, a spacer formed of one of benzocyclobutene, photoacrylic, and polyimide, which is a transparent organic material, may be disposed on the bank 115g.

The bank 115g may include an opening exposing a portion of the anode 141 by removing a portion of the bank 115g in the emission area.

The bank 115g may be disposed to extend to a portion of the non-active area NA, but the present disclosure is not limited thereto.

The light emitting unit 142 may be disposed between the anode 141 and the cathode 143.

The light emitting unit 142 which serves to emit light, may include at least one layer of a hole injection layer (HIL), a hole transport layer (HTL), a light emitting layer, an electron transport layer (ETL), and an electron injection layer (EIL), and some of the components may be omitted according to a structure or characteristics of the electroluminescent display device. Here, as the light emitting layer, an electroluminescent layer and an inorganic light emitting layer may also be applied.

The hole injection layer is disposed on the anode 141 and serves to facilitate hole injection.

The hole transport layer is disposed on the hole injection layer and serves to smoothly transfer holes to the light emitting layer.

The light emitting layer is disposed on the hole transport layer, and may include a material capable of emitting light of a specific color to thereby emit light of a specific color. In addition, a light emitting material may be formed using a phosphorescent material or a fluorescent material.

The electron injection layer may be further disposed on the electron transport layer. The electron injection layer is an organic layer that facilitates injection of electrons from the cathode 143, and may be omitted according to the structure and characteristics of the electroluminescent display device.

Meanwhile, by further disposing an electron blocking layer or a hole blocking layer for blocking a flow of holes or electrons at a position adjacent to the light emitting layer, it is possible to prevent a phenomenon in which the electrons move from the light emitting layer when injected into the light emitting layer and pass through the hole transport layer adjacent thereto or a phenomenon in which the holes move from the light emitting layer when injected into the light emitting layer and pass through the electron transport layer adjacent thereto, so that luminous efficiency can be improved.

The light emitting unit 142 may be disposed to extend to a portion of the non-active area NA, that is, a portion of the GIP area GA, but the present disclosure is not limited thereto.

The cathode 143 is disposed on the light emitting unit 142 and serves to supply electrons to the light emitting unit 142. In the bottom emission type, since the cathode 143 needs to supply electrons, it may be formed of a metallic material such as magnesium, silver-magnesium, which is a conductive material having a low work function, but is not limited thereto.

On the other hand, in the case of the top emission type, the cathode 143 may be formed of a transparent conductive oxide, such as indium tin oxide (ITO), indium zinc oxide (IZO), indium tin zinc oxide (ITZO), zinc oxide (ZnO) and tin oxide (TO).

The cathode 143 may be disposed to extend to a portion of the non-active area NA to cover the light emitting unit 142, but is not limited thereto.

The encapsulation layer 150 may be disposed on the cathode 143.

Specifically describing the encapsulation layer 150, a capping layer is formed on an upper surface of the substrate 110 on which the light emitting element 140 is formed, and a primary protective layer 150a, an organic layer 150b, and a secondary protective layer 150c are sequentially formed to constitute the encapsulation layer 150 serving as an encapsulation means. However, the number of inorganic layers and organic layers constituting the encapsulation layer 150 is not limited thereto.

In the case of the primary protective layer 150a, since it is formed of an inorganic insulating layer, stack coverage thereof is not good due to a lower step. However, since the organic layer 150b serves to perform planarization, the secondary protective layer 150c is not affected by a step due to a lower layer. In addition, since a thickness of the organic layer 150b formed of a polymer is sufficiently thick, cracks caused by foreign materials can be compensated for.

On a front surface of the substrate 110 including the secondary protective layer 150c, a multilayered protective film may be positioned to face it for encapsulation, and an adhesive which is transparent and has adhesive properties may be interposed between the encapsulation layer 150 and the protective film.

A polarizing plate for preventing reflection of light incident from the outside may be attached onto the protective film, but is not limited thereto.

Meanwhile, the buffer layer of the present disclosure may be disposed on the first planarization layer other than the passivation layer, which will be described with reference to FIG. 6.

Figure 6:
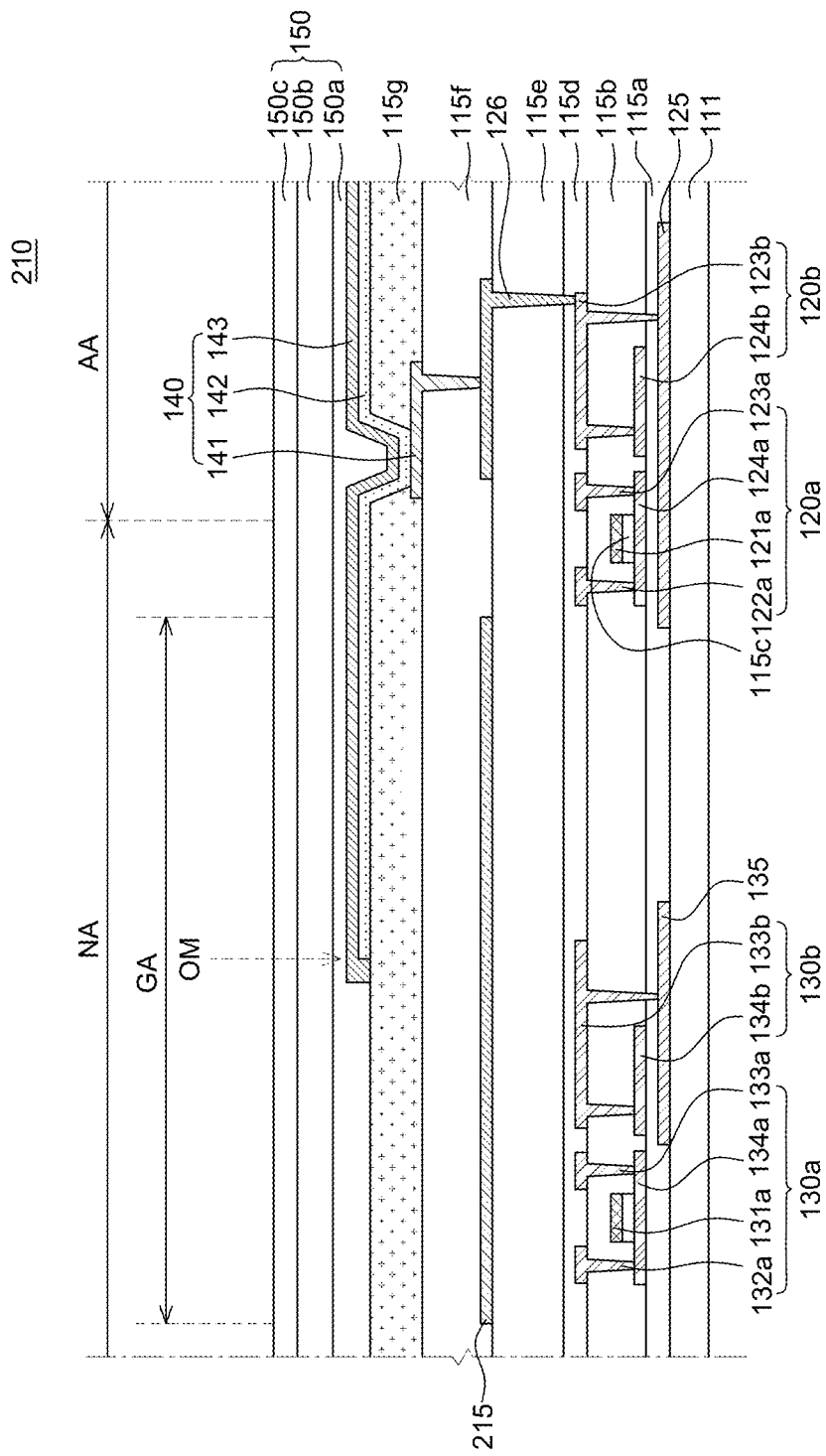
FIG. 6 is a cross-sectional view of a display panel according to a second exemplary embodiment of the present disclosure.

FIG. 6 is a cross-sectional view of a display panel according to a second exemplary embodiment of the present disclosure.

A display panel 210 according to the second exemplary embodiment of the present disclosure shown in FIG. 6 is different from the display panel 110 of FIGS. 3 and 4 only in terms of a position at which a buffer layer 215 is formed, and other configurations thereof are substantially the same, and thus, a duplicate description will be omitted. The same reference numerals are used for the same components.

Referring to FIG. 6, the display panel 210 according to the second exemplary embodiment of the present disclosure may include an active area AA and a non-active area NA.

The first and second thin film transistors 120a and 120b, the light emitting element 140 and the encapsulation layer 150 may be disposed in the active area AA of the substrate 111.

The non-active area NA of the substrate 111 may include a GIP area GA.

The third and fourth thin film transistors 130a and 130b and the encapsulation layer 150 may be disposed in the GIP area GA of the substrate 111.

Meanwhile, the second exemplary embodiment of the present disclosure is characterized in that the buffer layer 215 formed of silicon nitride is formed in the GIP area GA in a circumferential portion of the display panel 110 to thereby prevent hydrogen diffusion into the third and fourth oxide thin film transistors 130a and 130b in the GIP area GA.

As described above, the buffer layer 215 may have a quadrangular frame shape in the GIP area GA other than the active area AA. That is, the buffer layer 215 may have a quadrangular frame shape surrounding the perimeter of the active area AA.

The end of the light emitting unit 142 may be positioned in the buffer layer 250 in the GIP area GA.

The buffer layer 215 according to the second exemplary embodiment of the present disclosure may be disposed on the first planarization layer 115e, but is not limited thereto. In this case, the intermediate electrode 126 may be connected to the first and second thin film transistors 120a and 120b through a contact hole formed in the first planarization layer 115e. For example, the intermediate electrode 126 may be stacked to be connected to the second thin film transistor 120b. The buffer layer 215 according to the second exemplary embodiment of the present disclosure may be formed to be spaced apart from the intermediate electrode 126 when the intermediate electrode 126 is formed.

Meanwhile, the buffer layer of the present disclosure may be disposed on the first planarization layer as well as the passivation layer, which will be described with reference to FIG. 7.

Figure 7:
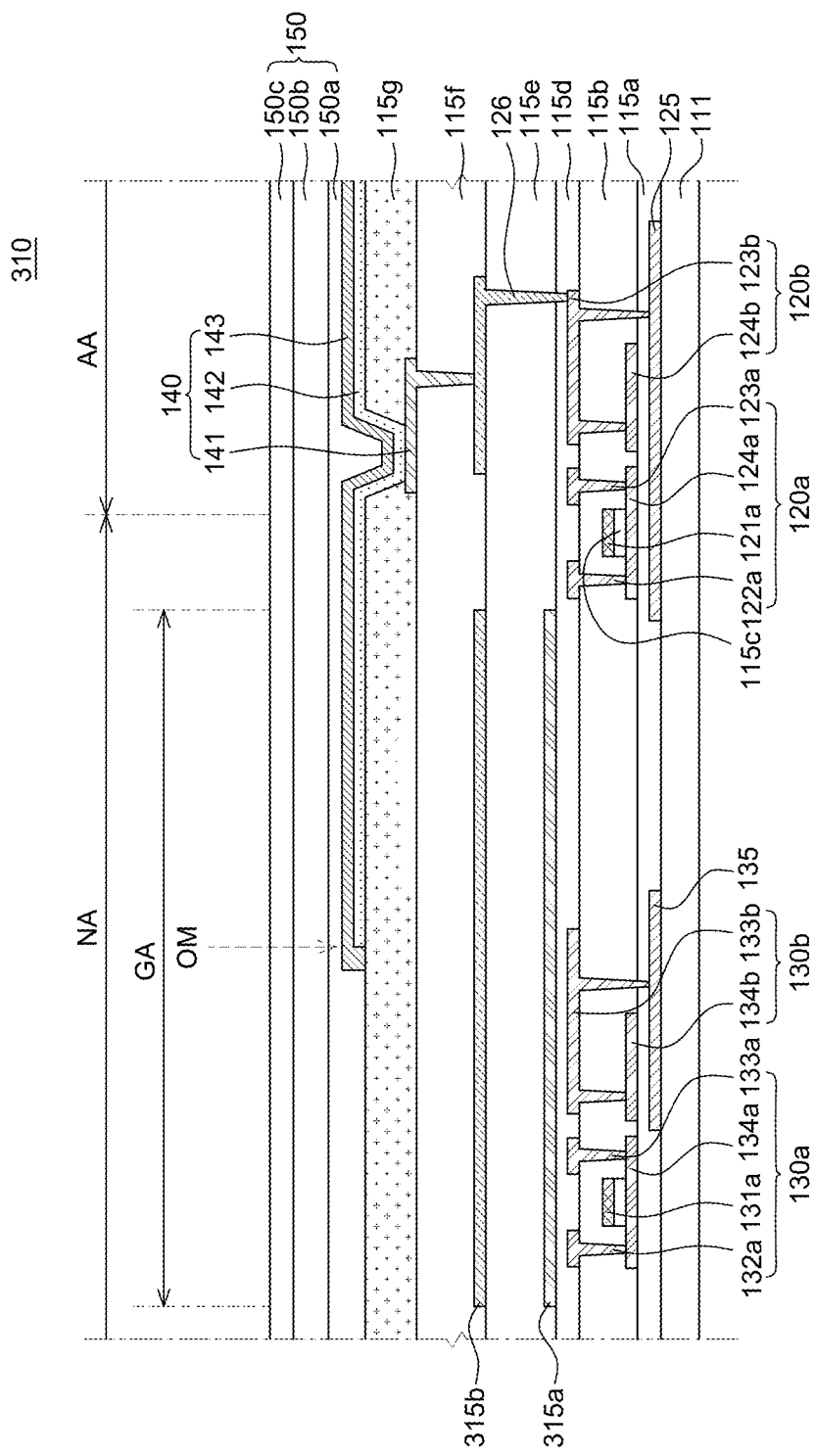
FIG. 7 is a cross-sectional view of a display panel according to a third exemplary embodiment of the present disclosure.

FIG. 7 is a cross-sectional view of a display panel according to a third exemplary embodiment of the present disclosure.

A display panel 310 according to the third exemplary embodiment of the present disclosure shown in FIG. 7 is different from the display panel 110 of FIGS. 3 and 4 only in terms of configurations of buffer layers 315a and 315b, and other configurations thereof are substantially the same, and thus, a duplicate description will be omitted. The same reference numerals are used for the same components.

Referring to FIG. 7, the display panel 310 according to the third exemplary embodiment of the present disclosure may include an active area AA and a non-active area NA.

The first and second thin film transistors 120a and 120b, the light emitting element 140 and the encapsulation layer 150 may be disposed in the active area AA of the substrate 111.

The non-active area NA of the substrate 111 may include a GIP area GA.

The third and fourth thin film transistors 130a and 130b and the encapsulation layer 150 may be disposed in the GIP area GA of the substrate 111.

Meanwhile, the third exemplary embodiment of the present disclosure is characterized in that the buffer layers 315a and 315b having a double structure, which are formed of silicon nitride are formed in the GIP area GA in the circumferential portion of the display panel 110 to thereby effectively prevent hydrogen diffusion into the third and fourth thin film transistors 130a and 130b in the GIP area GA.

As described above, the buffer layers 315a and 315b may have a quadrangular frame shape in the GIP area GA other than the active area AA. That is, the buffer layers 315a and 315b may have a quadrangular frame shape surrounding the perimeter of the active area AA.

The end of the light emitting unit 142 may be positioned in the buffer layers 315a and 315b in the GIP area GA.

In this case, the buffer layers 315a and 315b according to the third exemplary embodiment of the present disclosure include not only a first buffer layer 315a disposed on the passivation layer 115d but may also further include a second buffer layer 315b disposed on the first planarization layer 115e. That is, the third exemplary embodiment of the present disclosure includes the buffer layers 315a and 315b having a double structure, so that external moisture or hydrogen or hydrogen in the encapsulation layer may be primarily blocked by the second buffer layer 315b on the passivation layer 115d, and moisture or hydrogen that is not blocked by the second buffer layer 315b may be secondarily blocked by the first buffer layer 315a, so that it is possible to block moisture or hydrogen more effectively.

Meanwhile, the present disclosure may further include a hydrogen adsorption layer on the buffer layer, which will be described in detail with reference to FIGS. 8 and 9.

Figure 8:
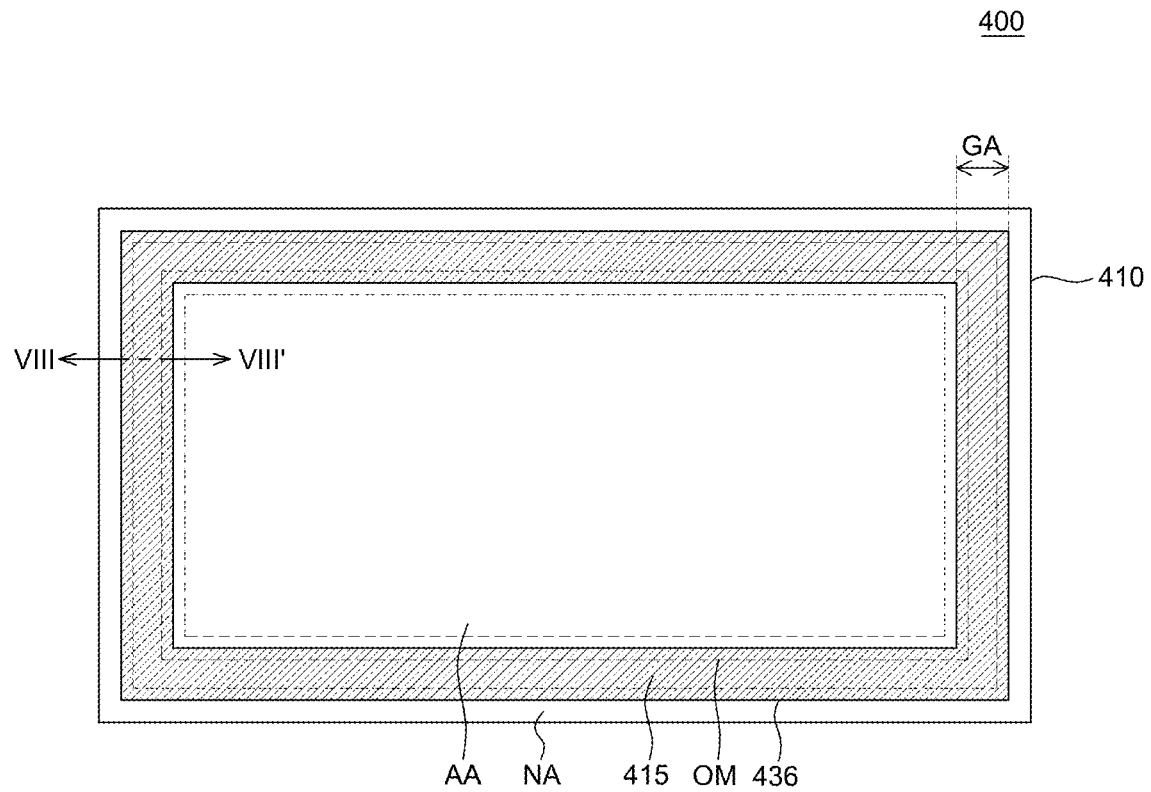
FIG. 8 is a plan view of an electroluminescent display device according to a fourth exemplary embodiment of the present disclosure.

FIG. 8 is a plan view of an electroluminescent display device according to a fourth exemplary embodiment of the present disclosure.

Figure 9:
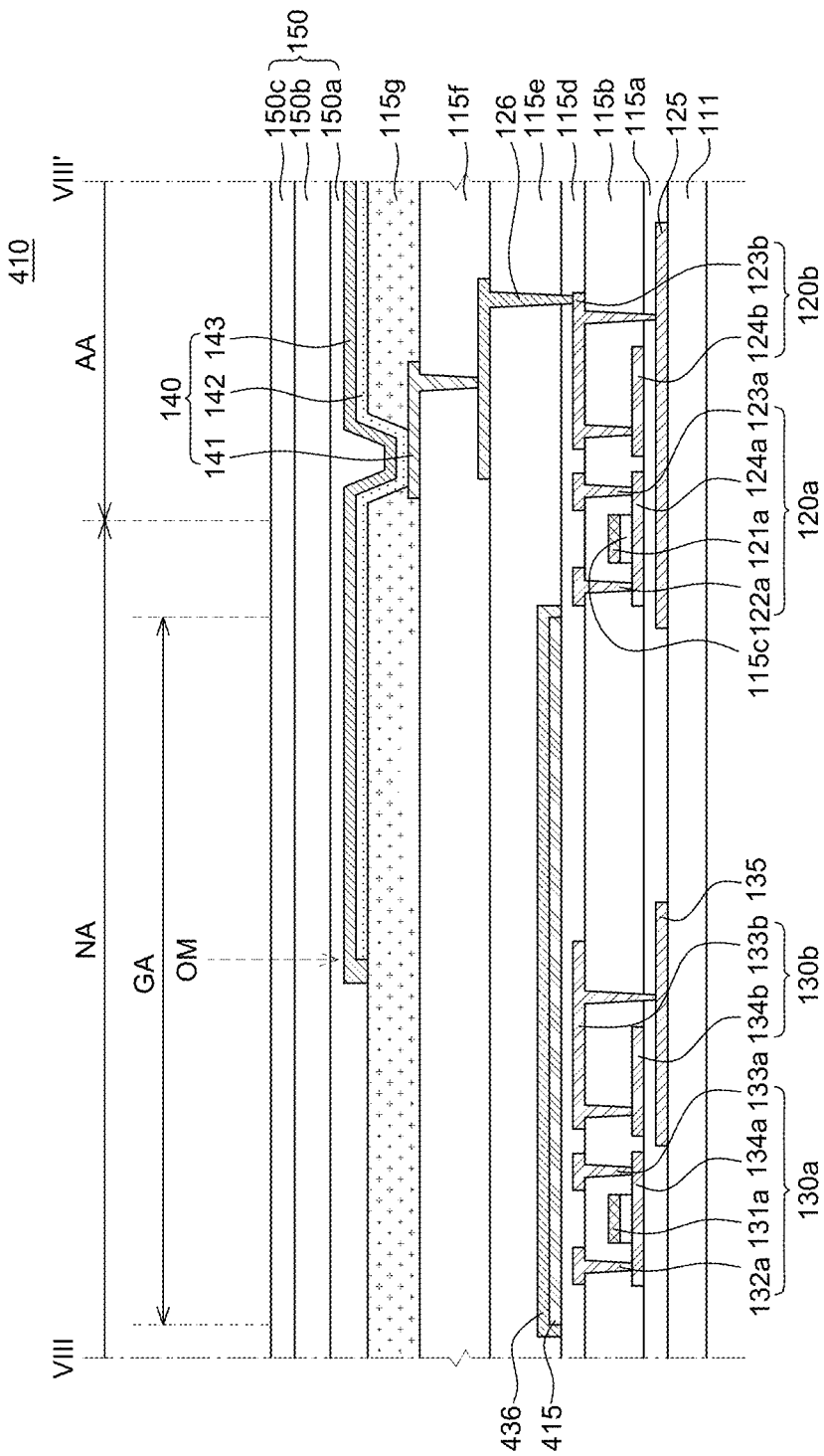
FIG. 9 is a cross-sectional view taken along line VIII-VIII' of FIG. 8.

FIG. 9 is a cross-sectional view taken along line VIII-VIII' of FIG. 8.

An electroluminescent display device 400 of the fourth exemplary embodiment of the present disclosure shown in FIGS. 8 and 9 is different from the electroluminescent display device 100 of FIGS. 3 and 4 only in terms of adding a hydrogen adsorption layer 436 on a buffer layer 415, and other configurations thereof are substantially the same, and thus, a duplicate description will be omitted. The same reference numerals are used for the same components.

FIG. 9 illustrates a portion of a cross-section of a display panel 410 according to the fourth exemplary embodiment of the present disclosure, including a gate in panel (GIP) area GA.

Referring to FIGS. 8 and 9, the display panel 410 according to the fourth exemplary embodiment of the present disclosure may include an active area AA and a non-active area NA.

The first and second thin film transistors 120a and 120b, the light emitting element 140 and the encapsulation layer 150 may be disposed in the active area AA of the substrate 111.

The non-active area NA of the substrate 111 may include a GIP area GA.

The third and fourth thin film transistors 130a and 130b and the encapsulation layer 150 may be disposed in the GIP area GA of the substrate 111.

Meanwhile, the fourth exemplary embodiment of the present disclosure is characterized in that a buffer layer 415 formed of silicon nitride is formed in the GIP area GA in the circumferential portion of the display panel 110 to thereby prevent hydrogen diffusion into the third and fourth thin film transistors 130a and 130b in the GIP area GA.

As described above, the buffer layer 415 may have a quadrangular frame shape in the GIP area GA other than the active area AA. That is, the buffer layer 415 may have a quadrangular frame shape surrounding a perimeter of the active area AA.

The end of the light emitting unit 142 may be positioned in the buffer layer 415 in the GIP area GA.

The buffer layer 415 according to the fourth exemplary embodiment of the present disclosure may be disposed on the passivation layer 115d, but is not limited thereto, and may be disposed on the first planarization layer 115e. Also, the buffer layer 415 may be disposed on the first planarization layer 115e as well as the passivation layer 115d. That is, the buffer layer 415 according to the fourth exemplary embodiment of the present disclosure may have a double structure.

Meanwhile, the fourth exemplary embodiment of the present disclosure is characterized by further including the hydrogen adsorption layer 436 on the buffer layer 415.

The hydrogen adsorption layer 436 may be disposed on the buffer layer 415 to cover the buffer layer 415. However, the present disclosure is not limited thereto, and the buffer layer 415 may be formed to protrude from an end of the hydrogen adsorption layer 436.

The hydrogen adsorption layer 436 may be disposed to surround the active area AA, and may have, for example, a quadrangular frame shape, but is not limited thereto.

The hydrogen adsorption layer 436 may first block hydrogen inflow through the buffer layer 415 in the GIP area GA by adsorbing external hydrogen or hydrogen in the encapsulation layer 150, thereby more effectively preventing hydrogen diffusion into the third and fourth thin film transistors 130a and 130b in the GIP area GA.

The hydrogen adsorption layer 436 may be formed of a metal having a hydrogen adsorption capability, such as Ti.

A material constituting the hydrogen adsorption layer 436 may include Sc, V, Pd, Nb, Zr, Y, Ta, Ce, La, Sm, U, and the like, that have excellent hydrogen adsorption capability in addition to Ti.

When the buffer layer 415 has a double structure as in the third exemplary embodiment as described above, the hydrogen adsorption layers 436 having a double structure may also be respectively formed on the buffer layers 415 having a double structure.

The exemplary embodiments of the present disclosure can also be described as follows:

According to an aspect of the present disclosure, there is provided an electroluminescent display device. The electroluminescent display device includes a substrate including an active area and a non-active area having a gate in panel (GIP) area outside the active area, an oxide thin film transistor disposed on the substrate in the GIP area, a passivation layer disposed on the oxide thin film transistor, a planarization layer disposed on the passivation layer, a buffer layer disposed on the passivation layer or the planarization layer in the GIP area and made of silicon nitride and a light emitting element disposed on the planarization layer and including an anode, a light emitting unit, and a cathode.

The buffer layer may be disposed only in the GIP area other than the active area.

The passivation layer may be made of silicon oxide.

The planarization layer may be made of one or more materials among acrylic resin, epoxy resin, phenolic resin, polyamides resin, polyimides resin, unsaturated polyesters resin, polyphenylene sulfides resin, polyphenylene resin, and Benzocyclobutene.

The buffer layer may be disposed to surround a perimeter of the active area.

An edge of the light emitting unit may be positioned in the GIP area, and the buffer layer may be disposed in the GIP area including a mark due to mask pressing occurring in an edge perimeter of the light emitting unit.

The electroluminescent display device may further include a hydrogen adsorption layer disposed on the buffer layer.

The hydrogen adsorption layer may be disposed on the buffer layer to cover the buffer layer.

The hydrogen adsorption layer may be disposed to surround a perimeter of the active area.

The hydrogen adsorption layer may be made of one or more of Ti, Sc, V, Mn, Fe, Pd, Nb, Zr, Y, Ta, Ce, La, Sm, and U.

The buffer layer may be disposed to protrude from an end of the hydrogen adsorption layer.

According to another aspect of the present disclosure, there is provided an electroluminescent display device. The electroluminescent display device includes a substrate including an active area and a non-active area having a gate in panel (GIP) area outside the active area, an oxide thin film transistor disposed on the substrate in the GIP area, a passivation layer disposed on the oxide thin film transistor, a planarization layer disposed on the passivation layer, a buffer layer disposed on the passivation layer or the planarization layer, a light emitting element disposed on the planarization layer and including an anode, a light emitting unit, and a cathode and an encapsulation layer disposed on the light emitting element, wherein the buffer layer may be made of silicon nitride and disposed in the GIP area to thereby block diffusion of external hydrogen or hydrogen in the encapsulation layer into the oxide thin film transistor therebelow.

The buffer layer may be disposed only in the GIP area other than the active area.

The electroluminescent display device may further include a hydrogen adsorption layer disposed on the buffer layer, and the hydrogen adsorption layer may be made of one or more of Ti, Sc, V, Mn, Fe, Pd, Nb, Zr, Y, Ta, Ce, La, Sm, and U.

The buffer layer and the hydrogen adsorption layer may be disposed to surround a perimeter of the active area.

The buffer layer may include a first buffer layer disposed on the passivation layer in the GIP area and a second buffer layer disposed on the planarization layer in the GIP area.

The buffer layer does not have a contact hole or does not come into contact with a contact hole configured in an upper layer or a lower layer thereof.

The buffer layer may be disposed between an edge of the light emitting element and the oxide thin film transistor disposed on the substrate in the GIP area.

The buffer layer may be disposed below an end of the light emitting unit and may be disposed over the oxide thin film transistor to cover a contact hole due to the oxide thin film transistor in the GIP area.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An electroluminescent display device, comprising:
a substrate including an active area and a non-active area having a gate in panel (GIP) area outside the active area;

an oxide thin film transistor disposed on the substrate in the GIP area;

a passivation layer disposed on the oxide thin film transistor;

a planarization layer disposed on the passivation layer;

a buffer layer disposed on the passivation layer or the planarization layer in the GIP area and made of silicon nitride; and a light emitting element disposed on the planarization layer and including an anode, a light emitting unit, and a cathode.

2. The electroluminescent display device of claim 1, wherein the buffer layer is disposed only in the GIP area other than the active area.

3. The electroluminescent display device of claim 1, wherein the passivation layer is made of silicon oxide.

4. The electroluminescent display device of claim 3, wherein the planarization layer is made of one or more materials among acrylic resin, epoxy resin, phenolic resin, polyamides resin, polyimides resin, unsaturated polyesters resin, polyphenylene sulfides resin, polyphenylene resin, and benzocyclobutene.

5. The electroluminescent display device of claim 2, wherein the buffer layer is disposed to surround a perimeter of the active area.

6. The electroluminescent display device of claim 1, wherein an edge of the light emitting unit is positioned in the GIP area, and wherein the buffer layer is disposed in the GIP area including a mark due to mask pressing occurring in an edge perimeter of the light emitting unit.

7. The electroluminescent display device of claim 1, further comprising: a hydrogen adsorption layer disposed on the buffer layer.

8. The electroluminescent display device of claim 7, wherein the hydrogen adsorption layer is disposed on the buffer layer to cover the buffer layer.

9. The electroluminescent display device of claim 7, wherein the hydrogen adsorption layer is disposed to surround a perimeter of the active area.

10. The electroluminescent display device of claim 7, wherein the hydrogen adsorption layer is made of one or more of Ti, Sc, V, Mn, Fe, Pd, Nb, Zr, Y, Ta, Ce, La, Sm, and U.

11. The electroluminescent display device of claim 7, wherein the buffer layer is disposed to protrude from an end of the hydrogen adsorption layer.

12. An electroluminescent display device, comprising:

a substrate including an active area and a non-active area having a gate in panel (GIP) area outside the active area;

an oxide thin film transistor disposed on the substrate in the GIP area;

a passivation layer disposed on the oxide thin film transistor;

a planarization layer disposed on the passivation layer;

a buffer layer disposed on the passivation layer or the planarization layer;

a light emitting element disposed on the planarization layer and including an anode, a light emitting unit, and a cathode; and an encapsulation layer disposed on the light emitting element, wherein the buffer layer is made of silicon nitride and disposed in the GIP area to thereby block diffusion of external hydrogen or hydrogen in the encapsulation layer into the oxide thin film transistor therebelow.

13. The electroluminescent display device of claim 12, wherein the buffer layer is disposed only in the GIP area other than the active area.

14. The electroluminescent display device of claim 12, further comprising: a hydrogen adsorption layer disposed on the buffer layer, wherein the hydrogen adsorption layer is made of one or more of Ti, Sc, V, Mn, Fe, Pd, Nb, Zr, Y, Ta, Ce, La, Sm, and U.

15. The electroluminescent display device of claim 14, wherein the buffer layer and the hydrogen adsorption layer are disposed to surround a perimeter of the active area.

16. The electroluminescent display device of claim 1, wherein the buffer layer includes:

a first buffer layer disposed on the passivation layer in the GIP area; and a second buffer layer disposed on the planarization layer in the GIP area.

17. The electroluminescent display device of claim 12, wherein the buffer layer includes:

a first buffer layer disposed on the passivation layer in the GIP area; and a second buffer layer disposed on the planarization layer in the GIP area.

18. The electroluminescent display device of claim 1, wherein the buffer layer does not have a contact hole or does not come into contact with a contact hole configured in an upper layer or a lower layer thereof.

19. The electroluminescent display device of claim 12, wherein the buffer layer does not have a contact hole or does not come into contact with a contact hole configured in an upper layer or a lower layer thereof.

20. The electroluminescent display device of claim 18, wherein the buffer layer is disposed between an edge of the light emitting element and the oxide thin film transistor disposed on the substrate in the GIP area.

21. The electroluminescent display device of claim 19, wherein the buffer layer is disposed between an edge of the light emitting element and the oxide thin film transistor disposed on the substrate in the GIP area.

22. The electroluminescent display device of claim 18, wherein the buffer layer is disposed below an end of the light emitting unit and is disposed over the oxide thin film transistor to cover a contact hole due to the oxide thin film transistor in the GIP area.

23. The electroluminescent display device of claim 19, wherein the buffer layer is disposed below an end of the light emitting unit and is disposed over the oxide thin film transistor to cover a contact hole due to the oxide thin film transistor in the GIP area.

* * * * *